United States Patent
Pimputkar et al.

(10) Patent No.: US 8,641,823 B2
(45) Date of Patent: *Feb. 4, 2014

(54) REACTOR DESIGNS FOR USE IN AMMONOTHERMAL GROWTH OF GROUP-III NITRIDE CRYSTALS

(75) Inventors: Siddha Pimputkar, Goleta, CA (US); Derrick S. Kamber, Goleta, CA (US); James S. Speck, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/128,083

(22) PCT Filed: Nov. 4, 2009

(86) PCT No.: PCT/US2009/063239
§ 371 (c)(1), (2), (4) Date: May 6, 2011

(87) PCT Pub. No.: WO2010/053965
PCT Pub. Date: May 14, 2010

(65) Prior Publication Data
US 2011/0220013 A1    Sep. 15, 2011

Related U.S. Application Data

(60) Provisional application No. 61/112,560, filed on Nov. 7, 2008.

(51) Int. Cl.
C30B 7/10       (2006.01)
C30B 29/40      (2006.01)
B01D 9/00       (2006.01)

(52) U.S. Cl.
CPC . *C30B 7/10* (2013.01); *C30B 29/40* (2013.01); *B01D 9/0031* (2013.01); *B01D 9/0013* (2013.01)
USPC ........ 117/224; 422/245.1; 422/254; 428/141; 428/697; 252/521.4; 252/521.5; 252/521.6; 252/62.55

(58) Field of Classification Search
CPC ........................................................ C30B 7/10
USPC ........................ 117/224; 422/245, 254, 245.1
See application file for complete search history.

(56) References Cited

U.S. PATENT DOCUMENTS 3,051,558 A * 8/1962 Jost ................................ 117/224
7,364,619 B2   4/2008 Dwilinski et al.
2007/0234946 A1  10/2007 Hashimoto et al.

FOREIGN PATENT DOCUMENTS

WO   WO2007/008198        1/2007
WO   WO 2007008198 A1 *   1/2007 ................ C30B 7/10

OTHER PUBLICATIONS

Li et al, "A new heating configuration for hydrothermal crystal growth vessels to achieve better thermal and flow environments", Journal of Crystal Growth 299 (2007) 109-119.*

(Continued)

*Primary Examiner* — Michael Kornakov
*Assistant Examiner* — Hua Qi
(74) *Attorney, Agent, or Firm* — Gates & Cooper LLP

(57) ABSTRACT

Reactor designs for use in ammonothermal growth of group-III nitride crystals. Internal heating is used to enhance and/or engineer fluid motion, gas mixing, and the ability to create solubility gradients within a vessel used for the ammonothermal growth of group-III nitride crystals. Novel baffle designs are used for control and improvement of continuous fluid motion within a vessel used for the ammonothermal growth of group-III nitride crystals.

21 Claims, 4 Drawing Sheets

(56) References Cited

OTHER PUBLICATIONS

Masuda et al, "Numerical Simulation of Hydrothermal Autoclave for Single-Crystal Growth Process", Journal of Thermal Science and Technology, vol. 3 (2008) No. 3 p. 540-551; Japanese original: Thermal Science and Engineering, vol. 15 (2007) No. 4 p. 189-196.*

Hongmin Li et al., "A new heating configuration for hydrothermal crystal growth vessels to achieve better thermal and flow environments" ScienceDirect, Journal of Crystal Growth 299 (2007) 109-119.

Yoshio Masuda et al., "Numerical Simulation of Hydrothermal Autoclave for Single-Crystal Growth Process", Journal of Thermal Science and Technology, vol. 3, No. 3, 2008 (both English and Japanese versions).

International Search Report and Written Opinion for PCT/US2009/063239.

* cited by examiner

REACTOR DESIGNS FOR USE IN AMMONOTHERMAL GROWTH OF GROUP-III NITRIDE CRYSTALS

CROSS REFERENCE TO RELATED APPLICATIONS

This application claims the benefit under 35 U.S.C. Section 119(e) of the following co-pending and commonly-assigned application:

U.S. Provisional Application Ser. No. 61/112,560, filed on Nov. 7, 2008, by Siddha Pimputkar, Derrick S., James S. Speck and Shuji Nakamura, entitled "REACTOR DESIGNS FOR USE IN AMMONOTHERMAL GROWTH OF GROUP-III NITRIDE CRYSTALS,";

which application is incorporated by reference herein.

This application is related to the following co-pending and commonly-assigned U.S. patent applications:

U.S. Utility patent application Ser. No. 11/921,396, filed on Nov. 30, 2007, by Kenji Fujito, Tadao Hashimoto and Shuji Nakamura, entitled "METHOD FOR GROWING GROUP-III NITRIDE CRYSTALS IN SUPERCRITICAL AMMONIA USING AN AUTOCLAVE," which application claims the benefit under 35 U.S.C. Section 365(c) of PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility Patent Application Ser. No. 11/765,629, filed on Jun. 20, 2007, by Tadao Hashimoto, Hitoshi Sato and Shuji Nakamura, entitled "OPTO-ELECTRONIC AND ELECTRONIC DEVICES USING N-FACE OR M-PLANE GaN SUBSTRATE PREPARED WITH AMMONOTHERMAL GROWTH," U.S. Pat. No. 7,755,172, which application claims the benefit under 35 U.S.C. Section 119(e) of U.S. Provisional Application Ser. No. 60/815,507, filed on Jun. 21, 2006, by Tadao Hashimoto, Hitoshi Sato, and Shuji Nakamura, entitled "OPTO-ELECTRONIC AND ELECTRONIC DEVICES USING N-FACE GaN SUBSTRATE PREPARED WITH AMMONOTHERMAL GROWTH,";

U.S. Utility Patent Ser. No. 12/234,244, filed on Sep. 19, 2008, by Tadao Hashimoto and Shuji Nakamura, entitled "GALLIUM NITRIDE BULK CRYSTALS AND THEIR GROWTH METHOD," U.S. Pat. No. 8,253,221, which application claims the benefit under 35 U.S.C. Section 119(e) of U.S. Provisional Patent Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD,";

U.S. Utility Patent Application Ser. No. 11/977,661, filed on Oct. 25, 2007, by Tadao Hashimoto, entitled "METHOD FOR GROWING GROUP HI-NITRIDE CRYSTALS IN A MIXTURE OF SUPERCRITICAL AMMONIA AND NITROGEN, AND GROUP III-NITRIDE CRYSTALS GROWN THEREBY," U.S. Pat. No. 7,803,344, which application claims the benefit under 35 U.S.C. Section 119(e) of U.S. Provisional Application Ser. No. 60/854,567, filed on Oct. 25, 2006, by Tadao Hashimoto, entitled "METHOD FOR GROWING GROUP-III NITRIDE CRYSTALS IN MIXTURE OF SUPERCRITICAL AMMONIA AND NITROGEN AND GROUP-III NITRIDE CRYSTALS,";

U.S. Utility Patent Application Ser. No. 12/612,477, filed Nov. 4, 2009, by Siddha Pimputkar, Derrick S. Kamber, Makoto Saito, Steven P. DenBaars, James S. Speck and Shuji Nakamura, entitled "GROUP-HI NITRIDE MONOCRYSTAL WITH IMPROVED CRYSTAL QUALITY GROWN ON AN ETCHED-BACK SEED CRYSTAL AND METHOD OF PRODUCING THE SAME," which application claims the benefit under 35 U.S.C. Section 119(e) of U.S. Provisional Application Ser. No. 61/111,644, filed on Nov. 5, 2008, by Siddha Pimputkar, Derrick S. Kamber, Makoto Saito, Steven P. DenBaars, James S. Speck and Shuji Nakamura, entitled "GROUP-III NITRIDE MONOCRYSTAL WITH IMPROVED CRYSTAL QUALITY GROWN ON AN ETCHED-BACK SEED CRYSTAL AND METHOD OF PRODUCING THE SAME,";

P.C.T. International Patent Application Serial No. PCT/US2009/063240, filed on Nov. 4, 2009, by Derrick S. Kamber, Siddha Pimputkar, Makoto Saito, Steven P. DenBaars, James S. Speck and Shuji Nakamura, entitled "GROUP-III NITRIDE MONOCRYSTAL WITH IMPROVED PURITY AND METHOD OF PRODUCING THE SAME," which application claims the benefit under 35 U.S.C. Section 119(e) of U.S. Provisional Application Ser. No. 61/112,555, filed on Nov. 7, 2008, by Derrick S. Kamber, Siddha Pimputkar, Makoto Saito, Steven P. DenBaars, James S. Speck and Shuji Nakamura, entitled "GROUP-III NITRIDE MONOCRYSTAL WITH IMPROVED PURITY AND METHOD OF PRODUCING THE SAME,";

P.C.T. International Patent Application Serial No. PCT/US2009/063238, filed on Nov. 4, 2009, by Siddha Pimputkar, Derrick S. Kamber, James S. Speck and Shuji Nakamura, entitled "NOVEL VESSEL DESIGNS AND RELATIVE PLACEMENTS OF THE SOURCE MATERIAL AND SEED CRYSTALS WITH RESPECT TO THE VESSEL FOR THE AMMONOTHERMAL GROWTH OF GROUP-III NITRIDE CRYSTALS," which application claims the benefit under 35 U.S.C. Section 119(e) of U.S. Provisional Application Ser. No. 61/112,552, filed on Nov. 7, 2008, by Siddha Pimputkar, Derrick S. Kamber, James S. Speck and Shuji Nakamura, entitled "NOVEL VESSEL DESIGNS AND RELATIVE PLACEMENTS OF THE SOURCE MATERIAL AND SEED CRYSTALS WITH RESPECT TO THE VESSEL FOR THE AMMONOTHERMAL GROWTH OF GROUP-III NITRIDE CRYSTALS,";

P.C.T. International Patent Application Serial No. PCT/US2009/063287, filed Nov. 4, 2009, by Siddha Pimputkar, Derrick S. Kamber, James S. Speck and Shuji Nakamura, entitled "ADDITION OF HYDROGEN AND/OR NITROGEN CONTAINING COMPOUNDS TO THE NITROGEN-CONTAINING SOLVENT USED DURING THE AMMONOTHERMAL GROWTH OF GROUP-III NITRIDE CRYSTALS," which application claims the benefit under 35 U.S.C. Section 119(e) of U.S. Provisional Application Ser. No. 61/112,558, filed on Nov. 7, 2008, by Siddha Pimputkar, Derrick S. Kamber, James S. Speck and Shuji Nakamura, entitled "ADDITION OF HYDROGEN AND/OR NITROGEN CONTAINING COMPOUNDS TO THE NITROGEN-CONTAINING SOLVENT USED DURING THE AMMONOTHERMAL GROWTH OF GROUP-III NITRIDE CRYSTALS TO OFFSET THE DECOMPOSITION OF THE NITROGEN-CONTAINING SOLVENT AND/OR MASS LOSS DUE TO DIFFUSION OF HYDROGEN OUT OF THE CLOSED VESSEL,";

P.C.T. International Patent Application Serial No. PCT/US2009/063236, filed on Nov. 4, 2009, by Siddha Pimputkar, Derrick S. Kamber, James S. Speck and Shuji Nakamura, entitled "CONTROLLING RELATIVE GROWTH RATES OF DIFERENT EXPOSED CRYSTALLOGRAPHIC FACETS OF A GROUP-III NITRIDE CRYSTAL DURING THE AMMONOTHERMAL GROWTH OF A GROUP-III NITRIDE CRYSTAL," which application claims the benefit under 35 U.S.C. Section 119(e) of U.S. Provisional Application Ser. No. 61/112,545, filed on Nov. 7, 2008, by Siddha Pimputkar, Derrick S. Kamber, James S. Speck and Shuji Nakamura, entitled "CONTROLLING RELATIVE GROWTH RATES OF DIFERENT EXPOSED CRYSTALLOGRAPHIC FACETS OF A GROUP-III NITRIDE CRYSTAL DURING THE AMMONOTHERMAL GROWTH OF A GROUP-III NITRIDE CRYSTAL;" and P.C.T. International Patent Application Serial No. PCT/US2009/063233, filed on Nov. 4, 2009, by Siddha Pimputkar, Derrick S. Kamber, James S. Speck and Shuji Nakamura, entitled "USING BORON-CONTAINING COMPOUNDS, GASSES AND FLUIDS DURING AMMONOTHERMAL GROWTH OF GROUP-III NITRIDE CRYSTALS," which application claims the benefit under 35 U.S.C. Section 119(e) of U.S. Provisional Application Ser. No. 61/112,550, filed on Nov. 7, 2008, by Siddha Pimputkar, Derrick S. Kamber, James S. Speck and Shuji Nakamura, entitled "USING BORON-CONTAINING COMPOUNDS, GASSES AND FLUIDS DURING AMMONOTHERMAL GROWTH OF GROUP-III NITRIDE CRYSTALS,"; all of which applications are incorporated by reference herein.

BACKGROUND OF THE INVENTION

1. Field of the Invention

This invention relates to ammonothermal growth of group-III nitrides.

2. Description of the Related Art

Ammonothermal growth of group-III nitrides, for example, GaN, involves placing, within a reactor vessel, group-III containing source materials, group-III nitride seed crystals, and a nitrogen-containing solvent, such as ammonia, sealing the vessel and heating the vessel to conditions such that the vessel is at elevated temperatures (between 23° C. and 1000° C.) and high pressures (between 1 atm and, for example, 30,000 atm). Under these temperatures and pressures, the nitrogen-containing solvent may become a supercritical fluid which normally exhibits enhanced solubility of the group-III containing source materials into solution. The solubility of the group-III containing materials into the nitrogen-containing solvent is dependent on the temperature, pressure and density of the solvent, among other things. By creating two different zones within the vessel, it is possible to establish a solubility gradient where, in one zone, the solubility will be higher than in a second zone. The group-III containing source materials are then preferentially placed in the higher solubility zone and the seed crystals in the lower solubility zone. By establishing fluid motion of the solvent with the dissolved source materials between these two zones, for example, by making use of natural convection, it is possible to transport the group-III containing source materials from the higher solubility zone to the lower solubility zone where the group-III containing source materials are deposited onto the seed crystals.

The current state of the art uses a device or vessel that contains the supercritical solvent and this vessel is heated to raise the entire vessel contents to elevated temperatures and pressures. The heating of the vessel is commonly performed by heating the outer walls of the vessel and, by virtue of heat transfer, heating the inner walls of the vessel, which, in turn, heats the solvent, group-III containing source materials, group-III nitride seed crystals and other material present within the vessel.

For the ammonothermal growth of group-III nitride crystals, it is important to establish solubility gradients. One method of producing these gradients is to establish temperature gradients since the solubility is a function of temperature, among other variables. Therefore, it is crucial for the growth characteristics of the group-III nitride crystals to establish well defined and controllable temperature gradients across well defined and placed spatial zones within the reactor.

In addition, many current reactor designs for the ammonothermal growth of group-III nitride crystals involve placing the group-III containing source materials and group-III nitride seed crystals within a vessel, where the vessel has a small ratio of inner diameter to length of vessel. By virtue of this design, the vessel has a long cylindrical shape wherein the group-III containing source materials or group-III nitride seed material are preferentially placed in different zones of the vessel, and the different zones are often separated by the use of baffle plates, which function as restriction devices for the fluid flow of the solvent, so it is possible to establish temperature gradients between the two zones.

Thus, what is needed in the art are new reactor vessel designs for use in ammonothermal growth of group-III nitride crystals. Specifically, what is needed in the art are improved techniques for heating reactor vessels used in ammonothermal growth of group-III nitride crystals. In addition, what is needed in the art are improved baffle designs for reactor vessels used in ammonothermal growth of group-III nitride crystals. The present invention satisfies these needs.

SUMMARY OF THE INVENTION

To overcome the limitations in the prior art described above, and to overcome other limitations that will become apparent upon reading and understanding the present invention, the present invention discloses improved reactor vessel designs for use in ammonothermal growth of group-III nitride crystals. The improvements include internal heating, which is used to enhance and/or engineer fluid motion, gas mixing, and the ability to create solubility gradients within the vessel, and novel baffle designs, which are used for control and improvement of continuous fluid motion within the vessel.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Apparatus Description

Figure 1:
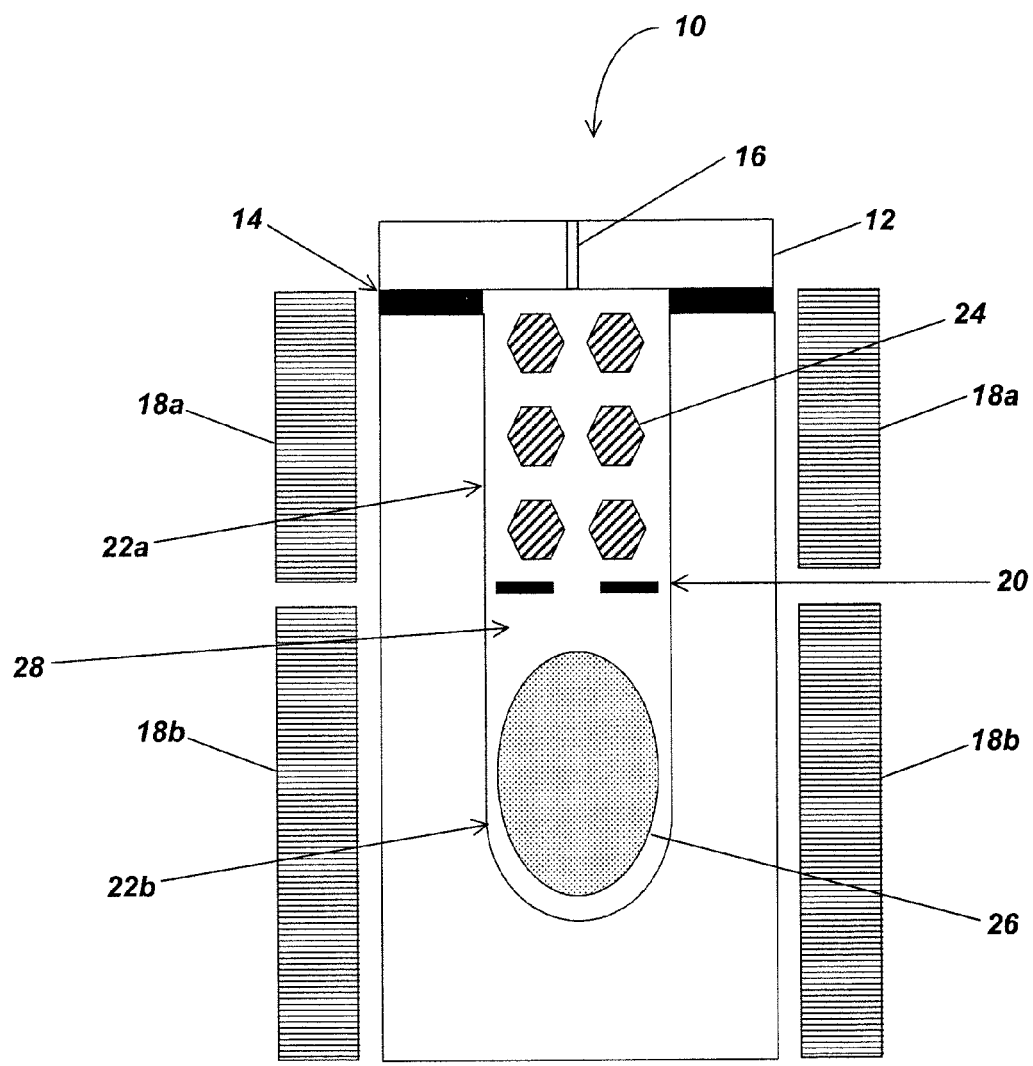
FIG. 1 is a schematic of a high-pressure vessel according to an embodiment of the present invention.

FIG. 1 is a schematic of an ammonothermal growth system comprising a high-pressure reaction vessel 10 according to one embodiment of the present invention. The vessel, which is an autoclave, may include a lid 12, gasket 14, inlet and outlet port 16, and external heaters/coolers 18a and 18b. A baffle plate 20 divides the interior of the vessel 10 into two zones 22a and 22b, wherein the zones 22a and 22b are separately heated and/or cooled by the external heaters/coolers 18a and 18b, respectively. An upper zone 22a may contain one or more group-III nitride seed crystals 24 and a lower zone 22b may contain one or more group-III-containing source materials 26, although these positions may be reversed in other embodiments. Both the group-III nitride seed crystals 24 and group-III-containing source materials 26 may be contained within baskets or other containment devices, which are typically comprised of a Ni—Cr alloy. The vessel 10 and lid 12, as well as other components, may also be made of a Ni—Cr based alloy. Finally, the interior of the vessel 10 is filled with a nitrogen-containing solvent 28 to accomplish the ammonothermal growth.

Process Description

Figure 2:
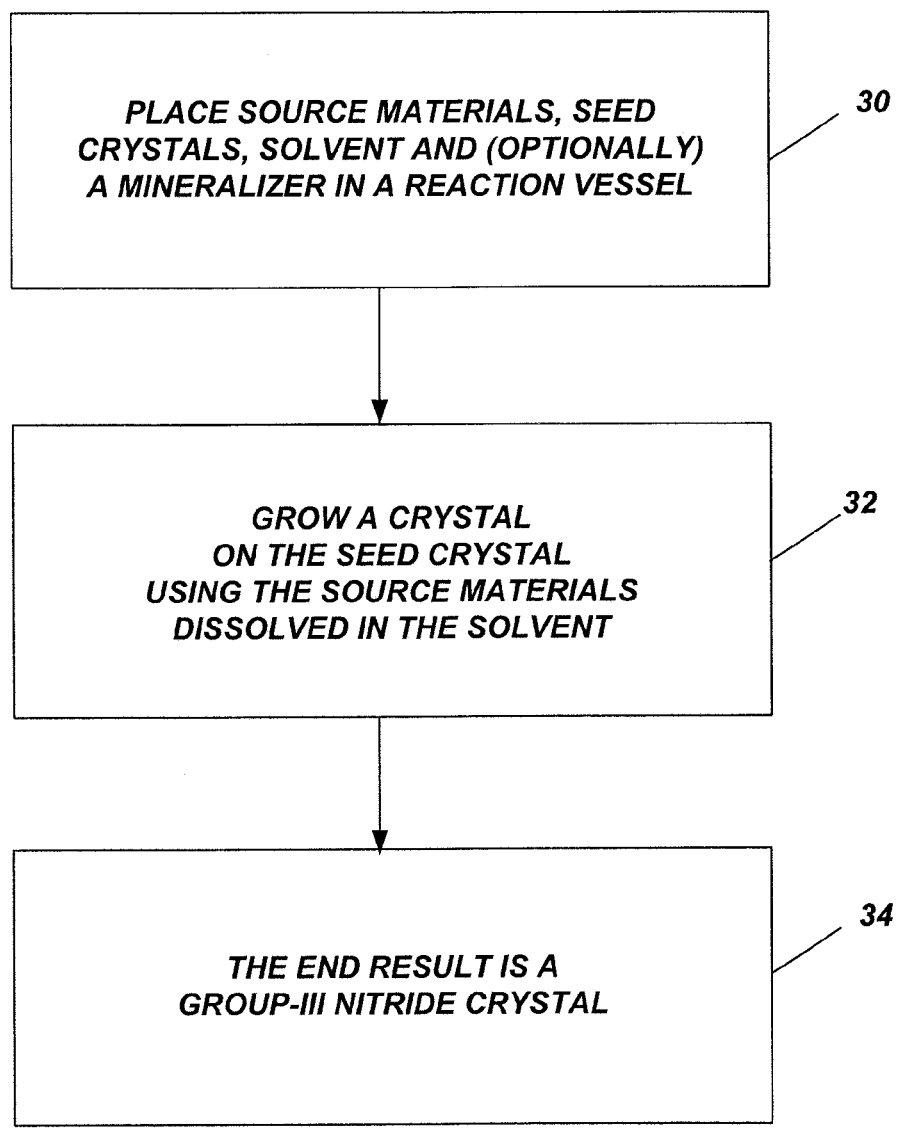
FIG. 2 is a flowchart illustrating the method according to an embodiment of the present invention.

FIG. 2 is a flow chart illustrating a method for obtaining or growing a group-III nitride-containing crystal using the apparatus of FIG. 1 according to one embodiment of the present invention.

Block 30 represents placing one or more group-III nitride seed crystals 24, one or more group-III containing source materials 26, and a nitrogen-containing solvent 28 in the vessel 10, wherein the seed crystals 24 are placed in a seed crystals zone (i.e., either 22a or 22b, namely the opposite of the zone 22b or 22a containing the source materials 26, the source materials 26 are placed in a source materials zone (i.e., either 22b or 22a, namely the opposite of the zone 22a or 22b containing the seed crystals 24). The seed crystals 24 comprise a group-III containing crystal; the source materials 26 comprise a group-III containing compound, a group-III element in its pure elemental form, or a mixture thereof, i.e., a group-III nitride monocrystal, a group-III nitride polycrystal, a group-III nitride powder, group-III nitride granules, or other group-III containing compound; and the nitrogen-containing solvent 28 is supercritical ammonia or one or more of its derivatives. An optional mineralizer may be placed in the vessel 10 as well, wherein the mineralizer increases the solubility of the source materials 26 in the supercritical nitrogen-containing solvent 28 as compared to the supercritical nitrogen-containing solvent 28 without the mineralizer.

Block 32 represents growing group-III nitride crystals on one or more surfaces of the seed crystals 24, wherein the conditions for growth include forming a temperature gradient between the seed crystals 24 and the source materials 26 that causes a higher solubility of the source materials 26 in the source materials zone and a lower solubility, as compared to the higher solubility, of the source materials 26 in the seed crystals zone. Specifically, growing the group-III nitride crystals on one or more surfaces of the seed crystal 24 occurs by changing the source materials zone temperatures and the seed crystals zone temperatures to create a temperature gradient between the source materials zone and the seed crystals zone that produces a higher solubility of the materials 26 in the solvent 28 in the source materials zone as compared to the seed crystals zone. For example, the source materials zone and seed crystals zone temperatures may range between 0° C. and 1000° C., and the temperature gradients may range between 0° C. and 1000° C.

Block 34 comprises the resulting product created by the process, namely, a group-III nitride crystal grown by the method described above. A group-III nitride substrate may be created from the group-III nitride crystal, and a device may be created using the group-III nitride substrate.

Fluid Motion within the Vessel

According to the present invention, fluid motion within the vessel 10 may be accomplished via a unique configuration of internal heaters and/or a unique baffle device design. These are described in more detail below.

Using Internal Heating to Enhance and/or Engineer Fluid Motion, Gas Mixing, and the Ability to Create Solubility Gradients within a Vessel Used for the Ammonothermal Growth of Group-III Nitride Crystals The present invention intends the use of internal heater(s)/cooler(s), in combination with, or instead of, external heaters/coolers 18a, 18b, which elevate or lower the exterior walls and, sequentially, the interior walls of the vessel 10 containing the seed crystals 24, the source materials 26, and the solvent 28, to different temperatures at different well defined spatial areas of the vessel 10.

In one embodiment, the baffle 20 is the internal heater/cooler. However, any number of internal heaters/coolers may be placed within the vessel 10 in any number of spatial locations within the vessel 10. The temperature of each internal heater/cooler may be the same or different depending on the particular effect that one wishes to achieve. The internal heater/cooler may present itself in any shape, form, size or material, yet it may be preferable to use high purity metals, or high purity metal coated ceramics. The internal heaters/coolers may or may not have a protective coating surrounding the elements thereof to prevent corrosion or other detrimental effects from the surrounding environment on their operation.

Although the internal heaters/coolers may be integrated into or onto other components present within the vessel, such as, but not limited to, the baffle 20, which are used to guide and/or restrict fluid flow within the vessel 10, the internal heaters/coolers may also be integrated into other components, such as a basket or containing device sometimes used to hold the seed crystals 24 r source materials 26.

The internal heaters/coolers may also be designed to encompass the entire inner surface of the vessel 10, thereby potentially eliminating the need for external heating or cooling of the vessel 10 to elevate or lower the temperatures within the vessel 10. This could potentially allow for the creation of higher pressure vessels, as the material barring the pressure is at a lower temperature, and enhance the mechanical characteristics of the current state of the art vessel designs used for the ammonothermal growth of group-III nitride crystals.

Some of the many possible purposes of the internal heaters/coolers are to establish a temperature gradient across a spatial zone surrounding the heaters/coolers and other spatial zones within the vessel 10. By establishing this temperature gradient, it is possible to establish solubility gradients, which, in turn, may be used to enhance the growth of the group-III nitride crystals. The ability to engineer different solubility zones within the vessel 10, without the restriction and sole use of external heaters/coolers and devices which manage the fluid flow within the vessel 10, for example, baffle devices 20, is substantial and will allow for more efficient and more effective designs which, in turn, may allow for the increased growth rates and improved crystal quality of the group-III nitride crystals.

Other immediate benefits of the internal heaters/coolers may be the ability to establish a zone around each heater/cooler that is at a higher or lower density than the surrounding fluid due to the difference in temperature between the zone and the surrounding medium. This density difference may provide fluid dynamical forces within the vessel 10, thereby enhancing fluid motion and hence mass transport of the solvent 28 with the dissolved source materials 26. One example of this particular aspect of the invention, although this should not be seen limiting in any way, would be a heater/cooler that is relatively long, held vertically and results in a temperature higher than the surrounding solvent 28. By heating the solvent 28, the solvent 28 will become a lower density material and will want to rise along the surface of the heater/cooler. The rising of the local, hotter supercritical solvent 28 is a demonstration of both a controlled convective flow within the vessel 10 and enhanced fluid motion. Not only does this example provide enhanced fluid motion, but the local hotter solvent 28 fluid may have a higher or lower solubility of the source materials 26 and therefore it may be advantageous to place either the source materials 26 or seed crystals 24 close to this zone within the vessel 10.

While the primary purpose of the internal heaters/coolers is to provide a controllable temperature gradient of any size between different spatial regions of the vessel 10, the internal heaters/coolers may also simultaneously be used as structural units within the vessel 10 to control and/or engineer fluid patterns within the vessel 10 itself. For example, the baffle 20 with an integrated heater/cooler can simultaneously heat or cool the solvent 28 and restrict solvent 28 flow. Alternatively, the internal heaters/coolers may be integrated into baskets or other devices used to hold the seed crystals 24 and/or contain the source materials 26, as well as provide a local temperature that is different from the surrounding solvent 28 fluid. The internal heaters/coolers may also be used, for example, as a liner material for the vessel 10 in a lower solubility zone where the growth of the group-III nitride crystals occurs. By changing the local temperature near the vessel 10 wall, it may be possible to prevent nucleation and sequential growth of the material on the vessel 10 wall surfaces as the solubility may be increased just in the vicinity of the walls.

Novel Baffle Designs for Control and Improvement of Continuous Fluid Motion within a Vessel Used for the Ammonothermal Growth of Group-III Nitride Crystals In order to improve on the mass transport within the vessel 10, the present invention also uses novel baffle devices 20 that enhance the mixing of fluids, e.g., the solvent 28 with the dissolved source materials 26, and additionally guide the fluid motion to circulate the fluid to a much greater degree, and furthermore, allow for greater penetration of the fluid into various areas of the vessel 10. This is achieved by the baffle devices 20 enhancing circular fluid motion patterns and additionally redirecting the flow of the fluid within the baffle device 20 itself.

Figure 3A:
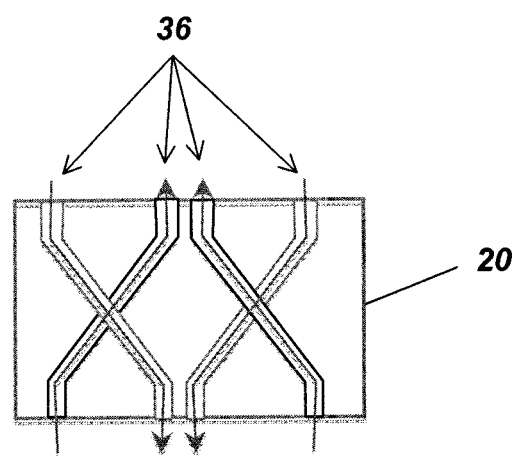
FIGS. 3(a) and 3(b) illustrate one possible embodiment of a baffle used in the high-pressure vessel of the present invention.
Figure 3B:
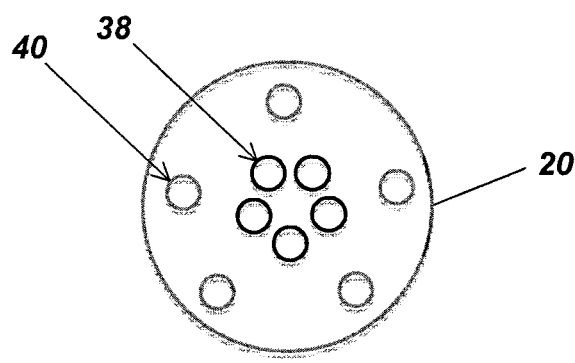

FIGS. 3(a) and 3(b) illustrate one possible embodiment of the baffle device 20 according to the present invention. Specifically, FIG. 3(a) is a side view of an exemplary baffle device 20 wherein the arrows 36 show the motion of the fluid through the baffle device 20, and FIG. 3(b) is a top view of the baffle device 20 showing the openings 38 and 40 for fluid transfer.

The basic idea entails having the fluid enter the baffle device 20, for example, on one side (e.g., the top surface), in the openings 40 near the outer edge of the baffle device 20 and exit through the openings 38 that are in a region that is closer to the center of the baffle device 20. Similarly, on the opposite side of the baffle device 20 (i.e., the bottom surface), the fluid may enter through the openings 40 near the outer edge of the baffle device 20 and exit through the openings 38 that are in a region that is closer to the center of the baffle device 20.

Alternative embodiments may reverse this fluid flow, namely the fluid may enter the baffle 20 through the region that is closer to the center of the baffle 20, and exit the baffle 20 near the outer edge of the baffle 20.

By virtue of this design for the baffle device 20, it may be possible to establish a continual motion of fluid within the vessel 10. The seed crystals 24 and source materials 26 can then be placed in the appropriate areas of the vessel 10 to provide optimal conditions for growth on the seed crystals 24 and/or for dissolution of the source materials 26 into the solvent 28.

Moreover, by incorporating internal heaters/coolers into the baffle device 20 itself, or by adding other internal heaters/coolers into the vessel 10, or by applying or extracting heat from the outside the walls of the vessel 10 by use of other heating or cooling mechanisms or devices, specifically in the region of the baffle 20, it is further possible to intentionally change the temperature, and hence, solubility, of the fluid exiting the baffle device 20 as compared to the fluid entering the baffle device 20.

This invention further includes the idea of designing the baffle device 20 not only to improve on fluid motion within the vessel 10, but also to guide particular fluids into one or more specific zones within the vessel 10. One example of this idea, which should not be considered limiting in any way, would be for the baffle device 20 to guide nutrient rich solvent 28, for example, solvent 28 coming from the source materials zone, towards the center of the vessel 10. By doing so, it may be possible to suppress nucleation and growth of group-III nitride material on undesired locations and/or surfaces within the vessel 10, for example, on the walls of the vessel 10, and further enhance growth of group-III nitride material on desired locations within the vessel 10, for example, on the group-III nitride seed crystals 24.

This invention is not limited to the above schematic presentation of one possible baffle device 20 design, but includes any possible design, which passively or actively redirects fluid motion and/or guides fluid motion without major redirection. This invention further includes the possibility and ability, depending on design of the baffle device 20, to change the temperature, pressure and/or other properties of the fluid while flowing through the baffle device. For example, if one uses a baffle device 20 design in combination with a heating element, it may be possible to heat the fluid simultaneously while flowing through the baffle device 20 itself.

Figure 4:
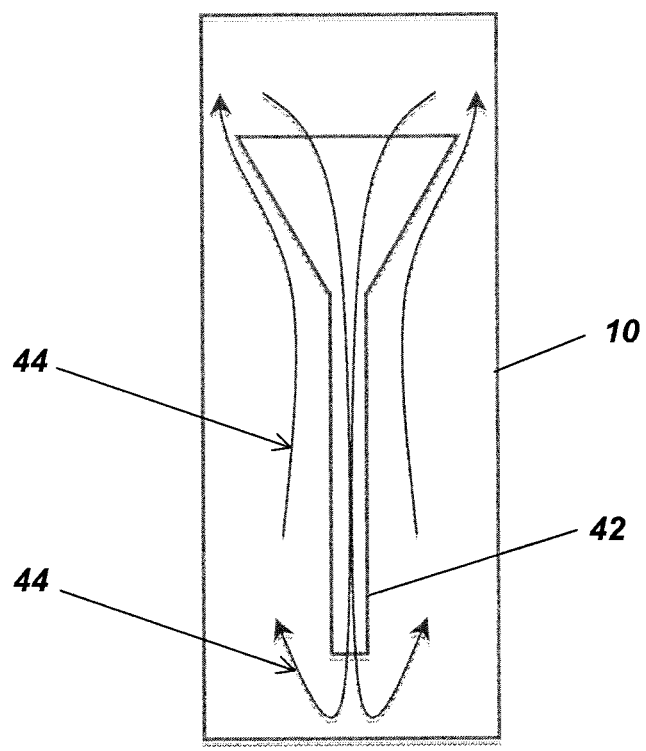
FIG. 4 illustrates another possible embodiment of a baffle used in the high-pressure vessel of the present invention.

Another possible example of a baffle device which guides fluid motion is schematically presented in FIG. 4, which shows the vessel 10 having a funnel-shaped baffle device 42 that establishes a continual circular motion of the fluid within the vessel 10, wherein the arrows 44 indicate the fluid motion of the solvent 28 through the vessel 10. Note that this baffle device 42 may incorporate heating and/or cooling mechanisms that supplement or eliminate the need for other heating and/or cooling devices outside of the vessel 10 and/or inside the vessel 10. Further, while the fluid motion in FIG. 4 is fairly simple, other fluid motion could be engineered as well by means of the design of the baffle device 42. Such design could create any number of difference zones within the vessel 10 having different characteristics, including but not limited to, solubility, fluid velocity, laminar or turbulent fluid flow patterns, and relative direction of fluid motion within the zones, temperature, pressure, and density of the various atoms, molecules, compounds and/or complexes.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus for growing crystals, comprising:
    (a) a vessel including a first zone containing source materials and a second zone containing seed crystals, wherein the vessel is filled with a solvent for dissolving the source materials and transporting the dissolved source materials to the seed crystals for growth of the crystals; and
    (b) one or more internal heaters or coolers placed within the vessel, wherein the internal heaters or coolers are in contact with the source materials and solvent to provide one or more temperature gradients between the zones within the vessel to influence the growth of the crystals.

2. The apparatus of claim 1, wherein the source materials comprise group-III containing source materials, the seed crystals comprise group-III nitride seed crystals, the solvent comprises a nitrogen-containing solvent, and the crystals comprise group-III nitride crystals.

3. The apparatus of claim 1, further comprising one or more external heaters or coolers outside the vessel to support the growth of the crystals.

4. The apparatus of claim 1, wherein the heaters or coolers comprise a plurality of heaters or coolers that establish a plurality of temperature zones within the vessel.

5. The apparatus of claim 1, wherein the heaters or coolers are included within or on a baffle that controls a flow of the solvent and the dissolved source materials therein between the zones.

6. An apparatus for growing crystals, comprising:
    (a) a vessel including a first zone containing source materials and a second zone containing seed crystals, wherein the reaction vessel is filled with a solvent for dissolving the source materials and transporting the dissolved source materials to the seed crystals for growth of the crystals; and
    (b) at least-one baffle within the vessel having one or more openings configured to control a flow of a fluid comprised of the solvent and the dissolved source materials therein between the zones, wherein one or more internal heaters or coolers are included within or on the baffle to provide one or more temperature gradients between the zones within the vessel to influence the growth of the crystals.

7. The apparatus of claim 6, wherein the source materials comprise group-III containing source materials, the seed crystals comprise group-III nitride seed crystals, the solvent comprises a nitrogen-containing solvent, and the crystals comprise group-III nitride crystals.

8. The apparatus of claim 6, wherein the baffle establishes a continual circular motion of the fluid within the vessel.

9. The apparatus of claim 6, wherein the fluid enters the baffle through one or more of the openings near an outer edge of the baffle and the fluid exits the baffle through one or more of the openings in a region that is closer to a center of the baffle.

10. The apparatus of claim 6, wherein the fluid enters the baffle through one or more of the openings in a region that is closer to the center of the baffle and the fluid exits the baffle through one or more of the openings near an outer edge of the baffle.

11. A method of growing crystals, comprising:
    (a) placing source materials into a first zone of a vessel;
    (b) placing seed crystals into a second zone of a vessel;
    (c) filling the vessel with a solvent for dissolving the source materials and transporting the dissolved source materials to the seed crystals for growth of the crystals; and
    (d) using one or more internal heaters or coolers within the vessel, wherein the internal heaters or coolers are in contact with the source materials and solvent to provide one or more temperature gradients between the zones within the vessel to influence the growth of the crystals.

12. The method of claim 11, wherein the source materials comprise group-III containing source materials, the seed crystals comprise group-III nitride seed crystals, the solvent comprises a nitrogen-containing solvent, and the crystals comprise group-III nitride crystals.

13. The method of claim 11, further comprising using one or more external heaters or coolers outside the vessel to support the growth of the crystals.

14. The method of claim 11, wherein the heaters or coolers comprise a plurality of heaters or coolers that establish a plurality of temperature zones within the vessel.

15. The method of claim 11, wherein the heaters or coolers are included within or on a baffle that controls a flow of the solvent and the dissolved source materials therein between the zones.

16. A method of growing crystals, comprising:
    (a) placing source materials into a first zone of a vessel;
    (b) placing seed crystals into a second zone of a vessel;
    (c) filling the vessel with a solvent for dissolving the source materials and transporting the dissolved source materials to the seed crystals for growth of the crystals; and
    (d) using one or more baffles within the vessel to control a flow of a fluid comprised of the solvent and the dissolved source materials therein between the zones, wherein one or more internal heaters or coolers are included within or on the baffles to provide one or more temperature gradients between the zones within the vessel to influence the growth of the crystals.

17. The method of claim 16, wherein the source materials comprise group-III containing source materials, the seed crystals comprise group-III nitride seed crystals, the solvent comprises a nitrogen-containing solvent, and the crystals comprise group-III nitride crystals.

18. The method of claim 16, wherein the baffle establishes a continual circular motion of the fluid within the vessel.

19. The method of claim 16, wherein the fluid enters the baffle near an outer edge of the baffle and the fluid exits the baffle through a region that is closer to a center of the baffle.

20. The method of claim 16, wherein the fluid enters the baffle through the region that is closer to the center of the baffle and the fluid exits the baffle near the outer edge of the baffle.

21. The method of claim 16, wherein the baffle is a funnel-shaped baffle that establishes a continual circular motion of the fluid through the baffle.

* * * * *